(12) United States Patent
Tanaka et al.

(10) Patent No.: US 10,170,919 B2
(45) Date of Patent: Jan. 1, 2019

(54) BATTERY PROTECTING APPARATUS

(71) Applicants: Nobuhito Tanaka, Tokyo (JP); Yoshihiro Satake, Tokyo (JP); Norihito Kawaguchi, Tokyo (JP); Koji Koshimizu, Tokyo (JP); Kaoru Usui, Tokyo (JP); Yusuke Ohba, Tokyo (JP)

(72) Inventors: Nobuhito Tanaka, Tokyo (JP); Yoshihiro Satake, Tokyo (JP); Norihito Kawaguchi, Tokyo (JP); Koji Koshimizu, Tokyo (JP); Kaoru Usui, Tokyo (JP); Yusuke Ohba, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 97 days.

(21) Appl. No.: 15/622,272

(22) Filed: Jun. 14, 2017

(65) Prior Publication Data

US 2018/0048167 A1    Feb. 15, 2018

(30) Foreign Application Priority Data

Aug. 12, 2016  (JP) ................... 2016-158801

(51) Int. Cl.
*H02J 7/00* (2006.01)
*H01L 23/49* (2006.01)
(Continued)

(52) U.S. Cl.
CPC ............ *H02J 7/0029* (2013.01); *H01L 23/49* (2013.01); *H01L 23/4951* (2013.01);
(Continued)

(58) Field of Classification Search
CPC ..................................................... H02J 7/0029
(Continued)

(56) References Cited

U.S. PATENT DOCUMENTS

2005/0017339 A1* 1/2005 Yoshiba ............ H01L 23/49575
257/686
2006/0263988 A1* 11/2006 Takahashi ......... H01L 23/49562
438/286
2017/0221800 A1* 8/2017 Nishikizawa ..... H01L 23/49575

FOREIGN PATENT DOCUMENTS

JP    2010-127805    6/2010
WO   2008/133188    11/2008

\* cited by examiner

*Primary Examiner* — Edward Tso
*Assistant Examiner* — Ahmed Omar
(74) *Attorney, Agent, or Firm* — IPUSA, PLLC

(57) ABSTRACT

A battery protecting apparatus includes: a charging/discharging control chip including a charging control FET and a discharging control FET connected to a secondary battery; a protecting chip configured to control, based on a voltage between both ends of the secondary battery, the FETs to prevent overcharging, over discharging, and an overcurrent; and a lead frame having a connection surface for a plurality of external terminals and another surface in conduction with the connection surface. Said another surface is electrically connected, via a conductive material, to terminals of the FETs formed on a front surface of the charging/discharging control chip. A back surface of the protecting chip faces a back surface of the charging/discharging control chip via an insulative member. Terminals of the protecting chip are electrically connected to said another surface through bonding wires. The charging/discharging control chip and the protecting chip are covered by a resin.

5 Claims, 6 Drawing Sheets

(51) Int. Cl.
*H01L 23/495* (2006.01)
*H01L 23/00* (2006.01)

(52) U.S. Cl.
CPC ...... *H01L 23/49575* (2013.01); *H02J 7/0042*
(2013.01); *H02J 7/0072* (2013.01); *H01L
23/49513* (2013.01); *H01L 24/13* (2013.01);
*H01L 24/16* (2013.01); *H01L 24/29* (2013.01);
*H01L 24/32* (2013.01); *H01L 24/49* (2013.01);
*H01L 24/73* (2013.01); *H01L 24/81* (2013.01);
*H01L 24/83* (2013.01); *H01L 24/92* (2013.01);
*H01L 2224/05554* (2013.01); *H01L
2224/13101* (2013.01); *H01L 2224/13144*
(2013.01); *H01L 2224/1403* (2013.01); *H01L
2224/16245* (2013.01); *H01L 2224/2919*
(2013.01); *H01L 2224/29101* (2013.01); *H01L
2224/29339* (2013.01); *H01L 2224/32145*
(2013.01); *H01L 2224/48091* (2013.01); *H01L
2224/49171* (2013.01); *H01L 2224/73265*
(2013.01); *H01L 2224/81192* (2013.01); *H01L
2224/83192* (2013.01); *H01L 2224/92225*
(2013.01); *H01L 2224/92247* (2013.01); *H01L
2924/00014* (2013.01); *H01L 2924/1306*
(2013.01); *H01L 2924/141* (2013.01); *H01L
2924/181* (2013.01); *H02J 2007/004*
(2013.01); *H02J 2007/0037* (2013.01); *H02J
2007/0039* (2013.01)

(58) Field of Classification Search
USPC ......................................................... 320/134
See application file for complete search history.

BATTERY PROTECTING APPARATUS

CROSS-REFERENCE TO RELATED APPLICATIONS

This patent application is based upon and claims the benefit of priority of Japanese Patent Application No. 2016-158801 filed on Aug. 12, 2016, the entire contents of which are incorporated herein by reference.

BACKGROUND OF THE INVENTION

1. Field of the Invention

The present disclosure relates to a battery protecting apparatus for a secondary battery.

2. Description of the Related Art

It is known that, for a battery pack that includes a secondary battery such as a lithium-ion battery, a semiconductor device for protecting overcharging, over discharging, and an overcurrent of the battery is provided.

In this semiconductor device, a chip for charging/discharging control that includes a Metal-Oxide-Semiconductor (MOS) switch and a chip for monitoring including a control circuit of the MOS switch are built in one package for size reduction. Further, in this semiconductor device, the chip for charging/discharging control is connected to electrodes through a plurality of bonding wires (Patent Document 1).

The above described technique has a disadvantageous structure in a case of decreasing the on-resistance because the resistance of the bonding wires is added to the resistance of the chip for charging/discharging control. In this structure, in order to decrease the on-resistance, it is required to perform wire bonding so that the number of bonding wires is increased to disperse the resistance.

However, in order to increase the number of bonding wires, it is required to enlarge sizes of terminals at the package side. Therefore, it does not contribute to size reduction. Further, a method of enlarging the size of the charging/discharging chip is considered but, the package size is enlarged by this method.

RELATED ART DOCUMENT

Patent Document

[Patent Document 1]: Japanese Laid-open Patent Publication No. 2010-127805

SUMMARY OF THE INVENTION

An object of the present disclosure is to provide a battery protecting apparatus that can contribute to size reduction and decrease of on-resistance.

According to one aspect of the present disclosure, there is provided a battery protecting apparatus packaged for preventing overcharging, over discharging, and an overcurrent in a secondary battery. The battery protecting apparatus includes a charging/discharging control chip including a charging control field effect transistor and a discharging control field effect transistor that are connected to the secondary battery; a protecting chip configured to control, based on a voltage between both ends of the secondary battery, the charging control field effect transistor and the discharging control field effect transistor to prevent the overcharging, the over discharging, and the overcurrent of the secondary battery; and a lead frame having a connection surface for a plurality of external terminals and having another surface that is in a state of conduction with the connection surface, wherein said another surface of the lead frame is electrically connected, via a conductive material, to terminals of the charging control field effect transistor and the discharging control field effect transistor formed on a front surface of the charging/discharging control chip, wherein the protecting chip is mounted such that a back surface of the protecting chip faces a back surface of the charging/discharging control chip via an insulative member, wherein terminals of the protecting chip are electrically connected to said another surface of the lead frame through bonding wires, and wherein the charging/discharging control chip and the protecting chip are covered by a resin.

DETAILED DESCRIPTION OF THE PREFERRED EMBODIMENTS

Figure 1A:
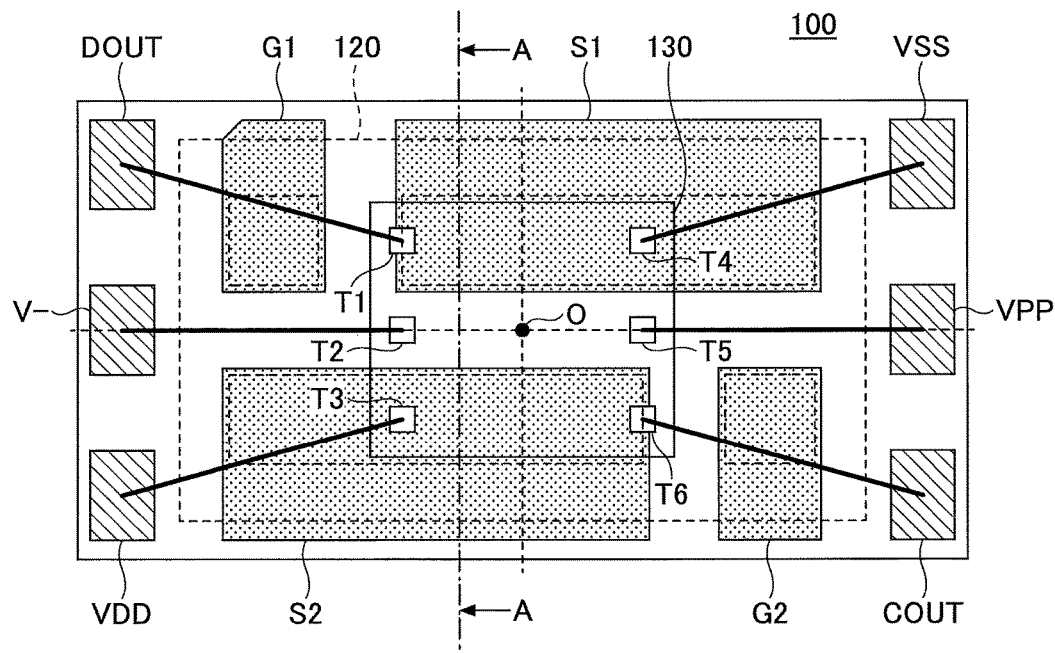
FIGS. 1A and 1B are diagrams describing a battery protecting apparatus according to an embodiment.
Figure 1B:
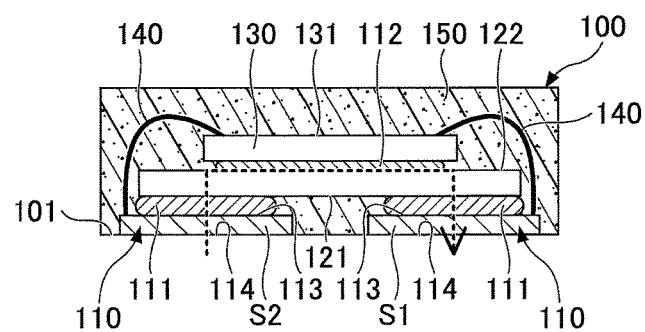

In the following, an embodiment will be described with reference to the drawings. FIGS. 1A and 1B are diagrams of describing a battery protecting apparatus 100 according to the embodiment. FIG. 1A is a transparent top view of the battery protecting apparatus 100 according to the embodiment. FIG. 1B is a cross sectional view of the battery protecting apparatus 100 taken along a line A-A of FIG. 1A.

The battery protecting apparatus 100 according to the embodiment includes a lead frame 110, a chip 120 for charging/discharging control, a chip 130 for protection, bonding wires 140, and a resin 150. The lead frame 110, the chip 120 for charging/discharging control, the chip 130 for protection, and the bonding wires 140 are sealed (covered) by the resin 150.

The battery protecting apparatus 100 according to the embodiment is connected to a secondary battery such as a lithium-ion battery, for example. The chip 120 for charging/discharging control includes a charging control Field Effect Transistor (FET) and a discharging control FET. The chip 120 for charging/discharging control controls, in accordance with a control signal from the chip 130 for protection, disconnection/connection between the secondary battery and a load or an electric power supply source.

The chip 130 for protection monitors a voltage between both ends of the secondary battery to output, to the chip 120 for charging/discharging control, the control signal of controlling disconnection/connection between the secondary battery and the load or the electric power supply source (charger).

The lead frame 110 of the embodiment includes electrode terminals DOUT, COUT, V−, VDD, VSS, VPP, G1, G2, S1, and S2. These electrode terminals are external terminals of the battery protecting apparatus 100. The respective electrode terminals will be described later below. Further, according to the embodiment, in the lead frame 110, a surface 114 opposite to an application surface 113 to which a conductive material 111 is applied is referred to as a connection surface 114 for the external terminals. The application surface 113 of the lead frame 110 is in a state of conduction with the connection surface of the lead frame 110.

The chip 120 for charging/discharging control of the embodiment is die-bonded on the conductive material 111 applied to the application surface 113 of the lead frame 110. In other words, the chip 120 for charging/discharging control is arranged on the conductive material 111 applied to the electrode terminals G1, G2, S1, and S2.

At this time, the chip 120 for charging/discharging control is die-bonded such that the surface 121 on which electrodes (terminals) are formed faces the application surface 113 of the lead frame 110. Therefore, according to the embodiment, the electrodes (terminals) of the chip 120 for charging/discharging control are electrically connected, via the conductive material 111, to the electrode terminals G1, G2, S1, and S2 that the lead frame 110 forms. In other words, the terminals of the chip 120 for charging/discharging control of the embodiment are electrically connected to the connection surface 114 for the external terminals that the lead frame 110 includes.

The chip 130 for protection of the embodiment is arranged on an insulating adhesive agent 112 applied to the back surface 122 on which the electrodes are not formed at the chip 120 for charging/discharging control. At this time, the chip 130 for protection is arranged such that the back surface 132, on which the electrodes are not formed, is bonded to the insulating adhesive agent 112, which is an insulating member.

The surface 131 of the chip 130 for protection on which electrodes (terminals) are formed is connected to the application surface 113 of the lead frame 110 through the bonding wires 140. More specifically, at the application surface 113 of the lead frame 110, the electrodes (terminals) T1 to T6 formed on the surface of the chip 130 for protection are respectively connected to the electrode terminals DOUT, V−, VDD, VSS, VPP, and COUT through the bonding wires 140. In other words, the terminals of the chip 130 for protection of the embodiment are electrically connected to the connection surface 114 for the external terminals that the lead frame 110 includes.

As described above, according to the battery protecting apparatus 100 of the embodiment, a bonding wire for connecting the chip 120 for charging/discharging control and the lead frame 110 is unnecessary. Therefore, the battery protecting apparatus 100 of the embodiment can contribute to decrease the on-resistance because the resistance of the bonding wire is reduced. Further, according to the embodiment, because the bonding wire is unnecessary, it is possible to contribute to reduce the size of the package.

Further, according to the embodiment, the electrodes (terminals) that the chip 120 for charging/discharging control includes and the electrodes (terminals) that the chip 130 for protection includes are respectively connected to the electrode terminals formed on the lead frame 110. The electrodes (terminals) that the chip 120 for charging/discharging control includes and the electrodes (terminals) that the chip 130 for protection includes are not connected to each other.

Specifically, the electrodes (terminals) that the chip 120 for charging/discharging control includes are connected to the electrode terminals G1, G2, S1, and S2. Further, the terminals T1 to T6, which the chip 130 for protection includes, are connected to the electrode terminals DOUT, COUT, V−, VDD, VSS, and VPP. Thus, in the battery protecting apparatus 100 according to the embodiment, there is no external terminal that is connected to both the chip 120 for charging/discharging control and the chip 130 for protection.

That is, in the battery protecting apparatus according to the embodiment, the chip 120 for charging/discharging control and the chip 130 for protection are separate from each other within the package, and it is possible to cause each of the chip 120 for charging/discharging control and the chip 130 for protection to operate through an independent input signal and possible to obtain, from each of the chip 120 for charging/discharging control and the chip 130 for protection, an independent output signal in accordance with the input. In other words, the terminals of the chip 120 for charging/discharging control and the terminals of the chip 130 for protection may be independent from each other.

Thus, according to the embodiment, when performing an operation test of the battery protecting apparatus 100, it is possible to independently operate the chip 120 for charging/discharging control and the chip 130 for protection. Therefore, the operation test can be easily performed. Further, according to the embodiment, for example, in a case where there is a failure or the like in the operation of the battery protecting apparatus 100, it is possible to easily analyze the cause of the failure or breakdown because independent output signals can be obtained from the respective chip 120 for charging/discharging control and the chip 130 for protection.

Further, according to the embodiment, a layout of the electrode terminals formed by the lead frame 110 is formed to have point symmetry with respect to the central point O of the external terminal surface 101 of the battery protecting apparatus 100. Further, according to the embodiment, the chip 120 for charging/discharging control is also arranged to be point-symmetric with respect to the central point O.

Further, according to the embodiment, the layout of the electrode terminals formed by the lead frame 110 is made such that the electrode terminal G1 and the electrode terminal DOUT are arranged to be next to be each other, and the electrode terminal G2 and the electrode terminal COUT are arranged to be next to be each other at the external terminal surface 101.

Note that at the battery protecting apparatus 100, the external terminal surface 101 of the embodiment is a surface where the electrode terminals formed by the lead frame 110 are exposed. The effects based on the layout of the electrode terminals of the embodiment will be described later below.

Next, processes of producing the battery protecting apparatus 100 of the embodiment will be described with reference to FIGS. 2A to 2G. FIGS. 2A to 2G are of diagrams of describing the processes of producing the battery protecting apparatus 100 according to the embodiment.

Figure 2A:
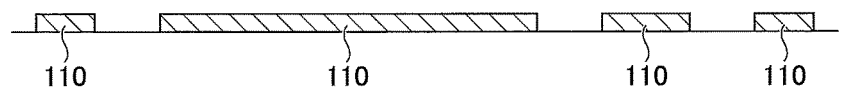
FIGS. 2A to 2G are diagrams describing processes of producing the battery protecting apparatus according to the embodiment.
Figure 2B:
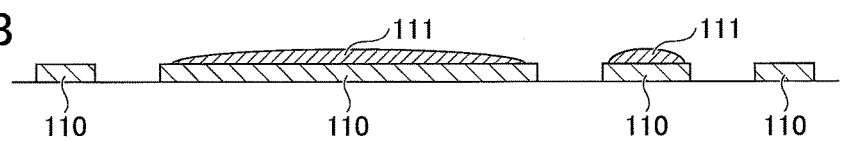

In the process of FIG. 2A, the lead frame 110 is formed on a substrate such as a stainless substrate. Note that this stainless substrate is to be peeled (removed) later such that the electrode terminals, which the lead frame 110 forms, are exposed as the external terminals of the battery protecting apparatus 100.

Next, in the process of FIG. 2, the conductive material 111 is applied onto the lead frame 110. For example, the conductive material 111 of the embodiment may be a paste such as a solder paste or a silver paste. According to the embodiment, the conductive material 111 may also be a bump such as a gold bump or a solder bump.

Figure 2C:
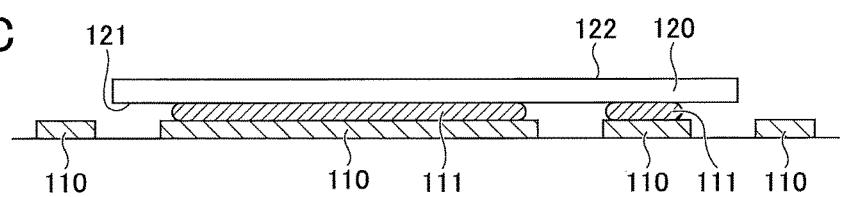

Next, in the process of FIG. 2C, the chip 120 for charging/discharging control is mounted on the conductive material 111 through flip-chip die-bonding. At this time, the chip 120 for charging/discharging control is mounted such that the surface 121 faces the application surface 113 of the lead frame 110. Accordingly, the electrodes formed on the surface 121 of the chip 120 for charging/discharging control are electrically connected to the lead frame 110 via the conductive material 111.

Figure 2D:
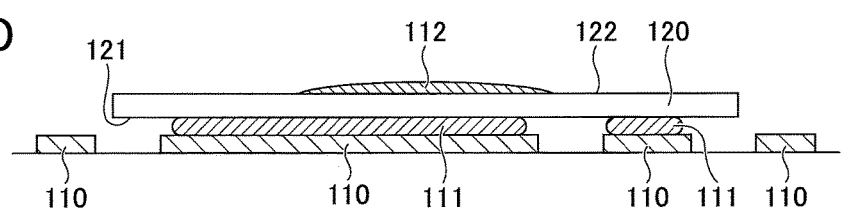
Figure 2E:
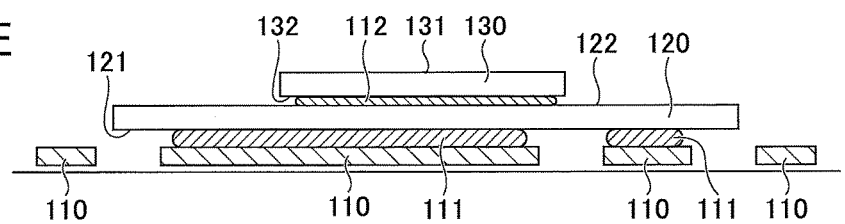

Next, in the process of FIG. 2D, the insulating adhesive agent 112, which is an insulative member, is applied to the back surface of the chip 120 for charging/discharging control. Next, in the process of FIG. 2E, the chip 130 for protection is mounted on the insulating adhesive agent 112. At this time, the chip 130 for protection is mounted such that the back surface 132 of the chip 130 is bonded (attached) to the insulating adhesive agent 112. In other words, the chip 130 for protection is mounted such that the back surface 132 faces the back surface 122 via the insulating adhesive agent 112.

Figure 2F:
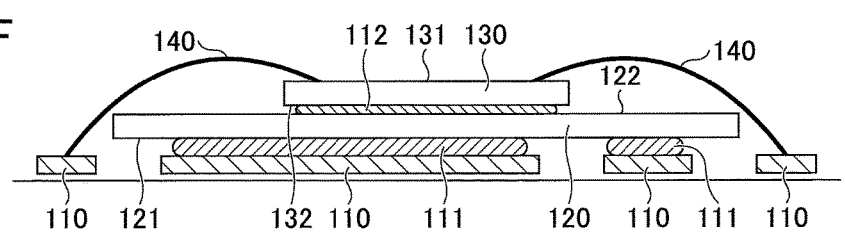

Next, in the process of FIG. 2F, the electrodes formed on the surface 131 of the chip 130 for protection, and the application surface 113 of the lead frame 110 are connected through wire bonding. Specifically, the respective terminals (electrodes) T1 to T6 formed on the surface 131 are connected to the electrode terminals DOUT, V−, VDD, VSS, VPP, and COUT through wire bonding.

Note that according to the embodiment, the wire bonding of connecting the terminals, formed on the surface 131, and the lead frame 110 may be performed by reverse bonding. According to the embodiment, the size of the package can be reduced by performing the reverse bonding to reduce the heights of the loops of the bonding wires 140.

Figure 2G:
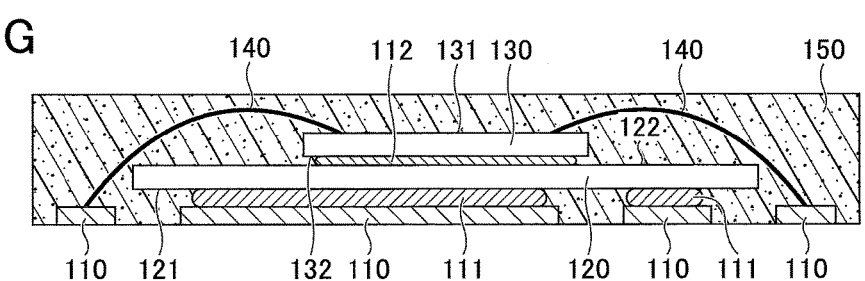

Next, in the process of FIG. 2G, the chip 120 for charging/discharging control, the chip 130 for protection, and the bonding wires 140 are sealed by the resin 150.

Next, a battery control system including the battery protecting apparatus 100 of the embodiment will be described with reference to FIG. 3 and FIG. 4.

Figure 3:
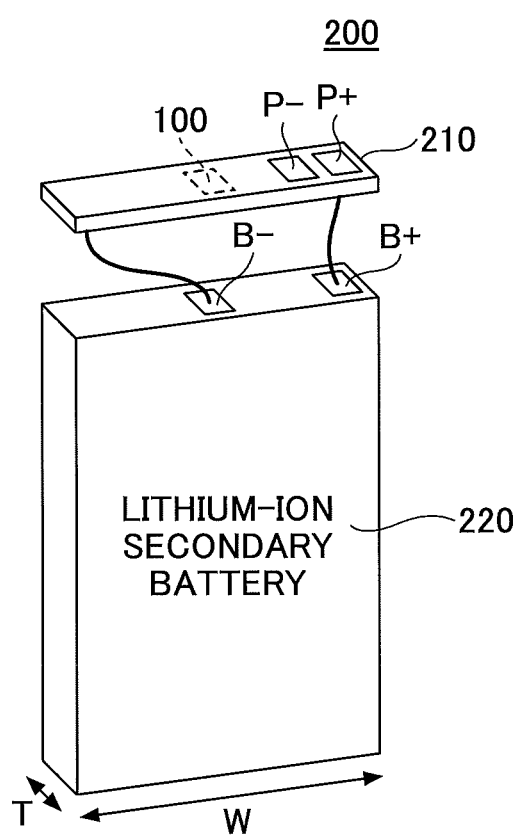
FIG. 3 is a diagram describing an example of a battery pack in which the battery protecting apparatus of the embodiment is mounted.

FIG. 3 is a diagram illustrating an example of a battery pack 200 in which the battery protecting apparatus 100 of the embodiment is mounted. In the battery pack 200 according to the embodiment, the battery protecting apparatus 100 is mounted on a wiring substrate 210, and is connected to a secondary battery 220. In other words, the battery protecting apparatus 100 may be packaged for preventing overcharging, over discharging, and an overcurrent in the secondary battery 220. The wiring substrate 210 includes a P− terminal and a P+ terminal on the back surface. The wiring substrate 210 includes a B− terminal and a B+ terminal on a component mounted surface (not illustrated). The secondary battery 220 includes a B− terminal that is a negative electrode terminal and a B+ terminal that is a positive electrode terminal.

The B+ terminal of the wiring substrate 210 is connected to the B+ terminal that is the positive electrode terminal of the secondary battery 220. The B− terminal of the wiring substrate 210 is connected to the B− terminal of the secondary battery 220.

Further, the P− terminal is connected to a load or a negative electrode of an electric power supply source, and the P+ terminal is connected to the load or a positive electrode of the electric power supply source. Note that the electric power source may be a charger or the like, for example.

Figure 4:
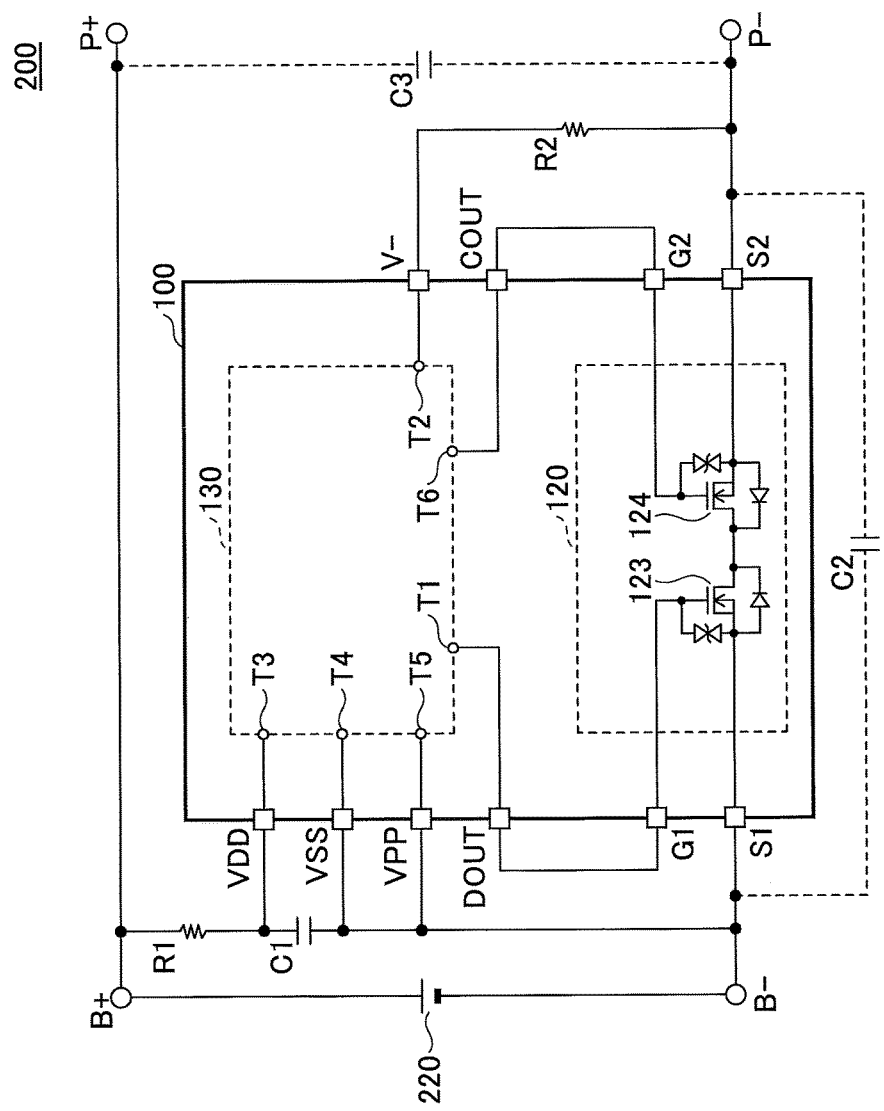
FIG. 4 is a diagram illustrating an equivalent circuit of a wiring substrate on which the battery protecting apparatus of the embodiment is mounted.

FIG. 4 is a diagram illustrating an equivalent circuit of the wiring substrate 210 on which the battery protecting apparatus 100 of the embodiment is mounted.

The battery pack 200 includes the chip 120 for charging/discharging control, the chip 130 for protection, the secondary battery 220, resistive elements R1 and R2, and capacitative elements C1 and C2.

The resistive elements R1 and R2 and the capacitative elements C1 and C2 are mounted on the wiring substrate 210 in order to prevent an erroneous motion, a breakdown, and the like due to an electrostatic breakdown, latch-up, and extrinsic noise.

In the battery protecting apparatus 100 of the embodiment, the chip 120 for charging/discharging control includes two Field Effect Transistors (FETs) 123 and 124. The FETs 123 and 124 may be connected to the secondary battery 220. The FET 123 is a discharging control FET that controls discharging/discharging-stop from the secondary battery 220. The FET 124 is a charging control FET that controls charging/charging-stop for the secondary battery 220.

The chip 130 for protection of the embodiment includes the terminals T1 to T6. The chip 130 for protection may control the FETs 123 and 124 based on a voltage between both ends of the secondary battery 220 to prevent the overcharging, over discharging, and the overcurrent of the secondary battery 220. The terminal T1 is connected to the electrode terminal DOUT, the terminal T2 is connected to the electrode terminal V−, and the terminal T3 is connected to the electrode terminal VDD. The terminal T4 is connected to the electrode terminal VSS, the terminal T5 is connected to the electrode terminal VPP, and the terminal T6 is connected to the electrode terminal COUT.

The terminal T1, which is connected to the electrode terminal DOUT, is a discharging control terminal that outputs a control signal used to control discharging from the secondary battery 220.

The terminal T6, which is connected to the electrode terminal COUT, is a charging control terminal that outputs a control signal used to control charging of the secondary battery 220.

The electrode terminal V− is a charger negative electrode connection terminal that is connected to the P− terminal. The electrode terminal VDD is a positive electrode connection terminal that is connected to the B+ terminal. The electrode terminal VSS is a negative electrode connection terminal that is connected to the B− terminal.

The electrode terminals S1, VSS, and VPP are connected to the B− terminal of the secondary battery 220, and the electrode terminal S2 is connected to the P− terminal of the charger. The electrode terminal VDD is connected to the P+ terminal of the charger or the secondary battery 220 via the resistive element R1. The electrode terminal V− is connected to the P− terminal of the charger via the resistive element R2. The electrode terminal DOUT is connected to the electrode terminal G1, and the electrode terminal COUT is connected to the electrode terminal G2.

The electrode terminal G1 is connected to a gate terminal of the FET 123. A control signal output from the electrode terminal DOUT of the chip 130 for protection is supplied to the gate terminal of the FET 123 of the chip 120 for charging/discharging control via the electrode terminal G1. On/off of the FET 123 is controlled by this control signal.

The electrode terminal G2 is connected to a gate terminal of the FET 124. A control signal output from the electrode terminal COUT of the chip 130 for protection is supplied to the gate terminal of the FET 124 of the chip 120 for charging/discharging control via the electrode terminal G2. On/off of the FET 124 is controlled by this control signal.

Further, the electrode terminal S1 is connected to a source terminal of the FET 123 of the chip 120 for charging/discharging control, and the electrode terminal S2 is connected to a source terminal of the FET 124 of the chip 120 for charging/discharging control.

Drain terminals of the FETs 123 and 124 are commonly connected in the chip 120 for charging/discharging control. Thus, when being mounted on a substrate such as a wiring substrate, the battery protecting apparatus 100 of the embodiment is easily mounted without connecting the drain terminals of the FETs 123 and 124 with each other at the outside of the chip 120 for charging/discharging control.

In a normal operation of the battery pack 200, when electric power is supplied to the load from the secondary battery 220 or when the secondary battery 220 is charged by the charger, an electric current flows from the terminal B− to the terminal P− because the chip 120 for charging/discharging control is in an on state. When the on-resistance of the chip 120 for charging/discharging control is high at this time, loss of electric power occurs together with heat generation. Accordingly, particularly, in a case where a high current is caused to flow from the terminal B− to the terminal P−, it is desired that the resistance between from the terminal B− to the terminal P− is low.

According to the battery protecting apparatus 100 of the embodiment, because a bonding wire is not used when the chip 120 for charging/discharging control is mounted, the resistance of the bonding wire can be eliminated.

Further, in the battery protecting apparatus 100 of the embodiment, through flip-chip die-bonding, the conductive material 111 is applied to the entire surfaces of the electrode terminals S1 and S2 that are source pads of the FETs 123 and 124. Hence, according to the embodiment, it is possible to decrease the on-resistance of the chip 120 for charging/discharging control, and to eliminate or reduce the loss due to the on-resistance.

Here, the effects based on the layout of the electrode terminals at the external terminal surface 101 of the battery protecting apparatus 100 of the embodiment will be described.

According to the embodiment, a path from the B− terminal to the P− terminal is the electric current path. In other words, according to the embodiment, a path from the electrode terminal S1 to the electrode terminal S2 of the battery protecting apparatus 100 is the electric current path. Thus, in order to reduce the loss of electric power due to the resistance and the heat generation, it is required to design the substrate by extending as much as possible a wire width from the B− terminal to the P− terminal.

Hence, in the battery protecting apparatus 100 of the embodiment, the electrode terminals are formed, at the external terminal surface 101, to have point symmetry with respect to the central point of the external terminal surface 101 (see FIG. 1A). In other words, in the battery protecting apparatus 100 of the embodiment, the chip 120 for charging/discharging control is formed to have point symmetry with respect to the central point O.

According to the embodiment, by making the layout of the electrode terminals in such a way, it is possible to widen the width of the wire between the B− terminal and the P− terminal in the wiring substrate 210.

Figure 5A:
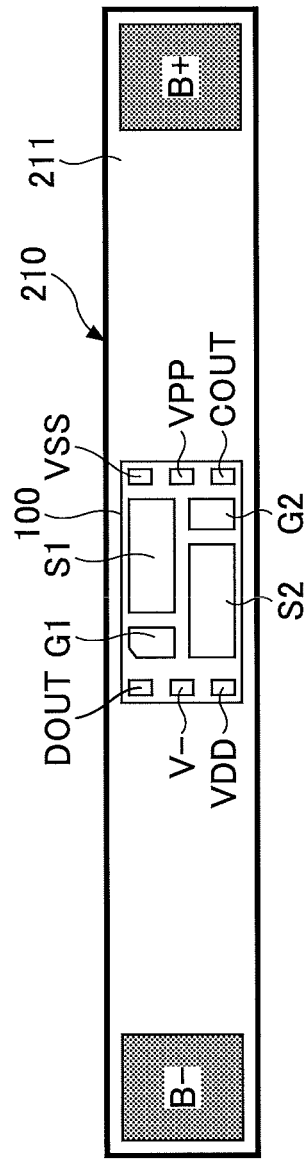
FIGS. 5A and 5B are diagrams describing a wire width from a B− terminal to a P− terminal.
Figure 5B:
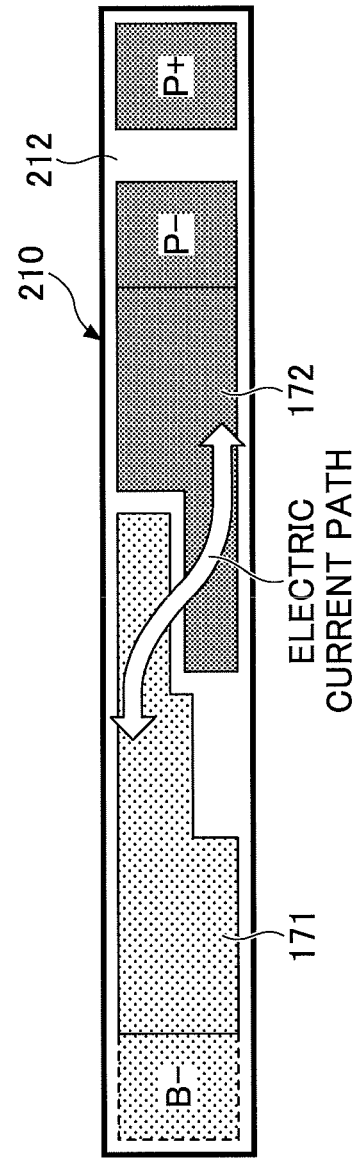

FIGS. 5A and 5B are diagrams of describing the wire width from the B− terminal to the P− terminal. FIG. 5A illustrate the component mounted surface (front surface) of the wiring substrate 210, and FIG. 5B illustrates the back surface of the wiring substrate 210.

In the example of FIG. 5, the battery protecting apparatus 100 is mounted on the component mounted surface (front surface) 211 of the wiring substrate 210, and the B− terminal and the B+ terminal are formed on the surface 211. Further, the P− terminal and the P+ terminal are formed on the back surface 212 of the wiring substrate 210.

According to the embodiment, the positions of the electrode terminal S1 and the electrode terminal S2 have point symmetry with respect to the central point O of the external terminal surface 101. Thus, between the B− terminal and the electrode terminal S1, without being disturbed by another wire, it is possible to easily widen the length of a wire 171, which connects the B− terminal and the electrode terminal S1, to the maximum width that can be taken in the wiring substrate 210.

Similarly, between the B+ terminal and the electrode terminal S2, without being disturbed by another wire, it is possible to easily widen the length of a wire 172, which connects the B+ terminal and the electrode terminal S2, to the maximum width that can be taken in the wiring substrate 210.

Although the battery protecting apparatus 100 is arranged such that the long sides of the wiring substrate 210 are substantially parallel to the long sides of the external terminal surface 101, the arrangement of the battery protecting apparatus 100 is not limited to this.

For example, according to the embodiment, the battery protecting apparatus 100 may be mounted on the wiring substrate 210 such that the short sides of the wiring substrate 210 are substantially parallel to the long sides of the external terminal surface 101. Even in this case, because the electrode terminals are arranged to be point-symmetric, it is possible to obtain effects similar to those described in FIG. 5.

That is, between the B− terminal and the electrode terminal S1 and between the B+ terminal and the electrode terminal S2, without being disturbed by another wire, it is possible to easily widen the widths of the respective wires, which connect the terminals, to be the maximum widths that can be taken in the wiring substrate 210.

Further, in the battery protecting apparatus 100 of the embodiment, the electrode terminal DOUT and the electrode terminal G1 are arranged to be next to be each other, and the electrode terminal COUT and the electrode terminal G2 are arranged to be next to be each other.

The control signal output from the electrode terminal DOUT is supplied to the electrode terminal G1. Further, the control signal output from the electrode terminal COUT is supplied to the electrode terminal G2.

Therefore, according to the embodiment, as described above, by arranging the electrode terminals such that the electrode terminal DOUT and the electrode terminal G1 are adjacent and the electrode terminal COUT and the electrode terminal G2 are adjacent, it is possible to easily connect the terminals without waste.

Figure 6A:
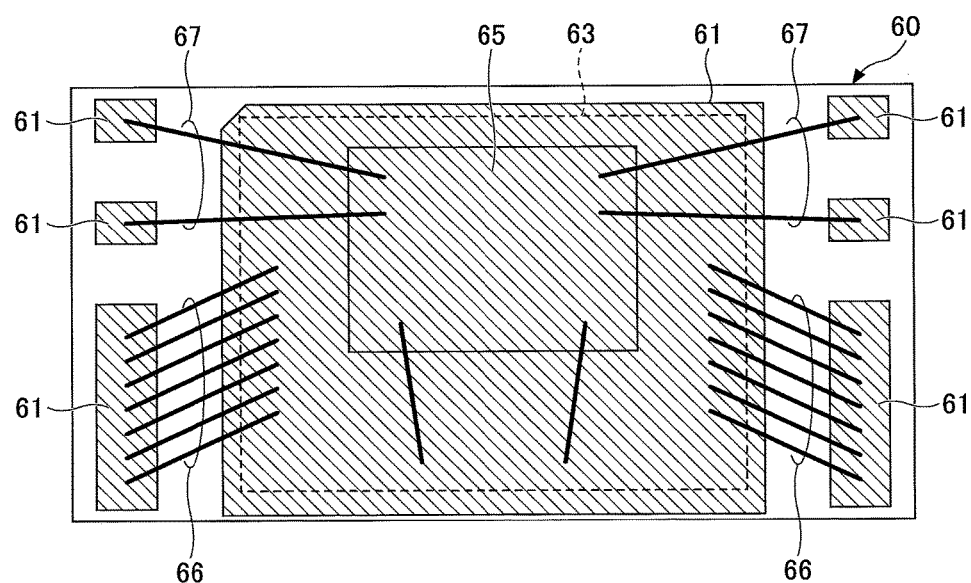
FIGS. 6A and 6B are diagrams illustrating a comparative example with respect to the embodiment.
Figure 6B:
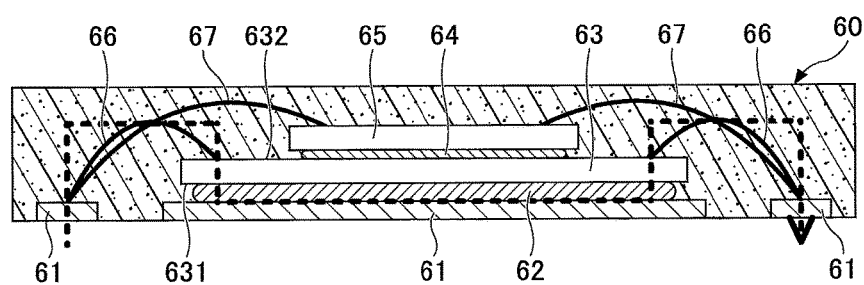

FIGS. 6A and 6B are diagrams illustrating a comparative example with respect to the embodiment. FIG. 6A is a transparent top view of a battery protecting apparatus 60 of the comparative example. FIG. 6B is a cross sectional view of the battery protecting apparatus 60 of the comparative example taken along a line A-A of FIG. 6A. In the battery protecting apparatus 60 illustrated in FIG. 6, a chip 63 for charging/discharging control is bonded on a conductive material 62 applied on a lead frame 61. At this time, the chip 63 for charging/discharging is arranged such that the back surface 631, on which electrodes are not formed, is bonded to the conductive material 62.

In the chip 63 for charging/discharging 63, an insulating adhesive agent 64 is applied to the surface 632 on which the electrodes are formed. A chip 65 for protection is bonded on the insulating adhesive agent 64.

Then, the surface of the chip 63 for charging/discharging and the lead frame 61 are connected through bonding wires 66. The surface 651 of the chip 65 for protection and the lead frame 61 are connected through bonding wires 67.

Accordingly, in the battery protecting apparatus 60 illustrated in FIG. 6, the resistance of the bonding wires 66 that connect the lead frame 61 and the chip 63 for charging/discharging is added to the on-resistance of the chip 63 for charging/discharging, and therefore the on-resistance increases.

On the other hand, according to the battery protecting apparatus 100 to which the embodiment is applied, because the bonding wires that connect the chip 120 for charging/discharging control and the lead frame 110 are unnecessary, the on-resistance does not increase. Further, according to the embodiment, the conductive material 111 can be applied to the entire surface of the source pad of the chip 120 for charging/discharging control to connect the chip 120 for charging/discharging control to the lead frame 110. Therefore, it is possible to further reduce the resistance in the connection between the chip 120 for charging/discharging control and the lead frame 110.

Although the present disclosure is described based on the embodiment, the present disclosure is not limited to the elements described in the above embodiment. Various variations and modifications may be made without departing from the scope of the present disclosure.

What is claimed is:

1. A battery protecting apparatus packaged for preventing overcharging, over discharging, and an overcurrent in a secondary battery, the battery protecting apparatus comprising:
    a charging/discharging control chip including a charging control field effect transistor and a discharging control field effect transistor that are connected to the secondary battery;
    a protecting chip configured to control, based on a voltage between both ends of the secondary battery, the charging control field effect transistor and the discharging control field effect transistor to prevent the overcharging, the over discharging, and the overcurrent of the secondary battery; and
    a lead frame having a connection surface for a plurality of external terminals and having another surface that is in a state of conduction with the connection surface,
    wherein said another surface of the lead frame is electrically connected, via a conductive material, to terminals of the charging control field effect transistor and the discharging control field effect transistor formed on a front surface of the charging/discharging control chip,
    wherein the protecting chip is mounted such that a back surface of the protecting chip faces a back surface of the charging/discharging control chip via an insulative member,
    wherein terminals of the protecting chip are electrically connected to said another surface of the lead frame through bonding wires, and
    wherein the charging/discharging control chip and the protecting chip are covered by a resin.

2. The battery protecting apparatus according to claim 1, wherein a drain of the charging control field effect transistor and a drain of the discharging control field effect transistor are commonly connected in the charging/discharging control chip.

3. The battery protecting apparatus according to claim 2, wherein a layout of the plurality of external terminals has point symmetry with respect to a central point of an external terminal surface where the plurality of external terminals are exposed at the battery protecting apparatus.

4. The battery protecting apparatus according to claim 1, wherein the terminals of the protecting chip and the terminals of the charging/discharging control chip are independent from each other.

5. The battery protecting apparatus according to claim 1, wherein among the plurality of external terminals, an external terminal, which is connected to a charging control terminal of the protecting chip, and an external terminal, which is connected to a gate terminal of the charging control field effect transistor, are arranged to be adjacent, and
    wherein among the plurality of external terminals, an external terminal, which is connected to a discharging control terminal of the protecting chip, and an external terminal, which is connected to a gate terminal of the discharging control field effect transistor, are arranged to be adjacent.

\* \* \* \* \*